(12) United States Patent
Van Rijswijk

(10) Patent No.: US 9,780,471 B2
(45) Date of Patent: Oct. 3, 2017

(54) PRINTED CIRCUIT BOARD ARRANGEMENT AND METHOD FOR MOUNTING A PRODUCT TO A MAIN PRINTED CIRCUIT BOARD

(71) Applicant: PHILIPS LIGHTING HOLDING B.V., Eindhoven (NL)

(72) Inventor: Nicolaas Antonie Van Rijswijk, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 15/313,401

(22) PCT Filed: May 18, 2015

(86) PCT No.: PCT/EP2015/060829
§ 371 (c)(1),
(2) Date: Nov. 22, 2016

(87) PCT Pub. No.: WO2015/177060
PCT Pub. Date: Nov. 26, 2015

(65) Prior Publication Data
US 2017/0194731 A1    Jul. 6, 2017

(30) Foreign Application Priority Data

May 22, 2014 (EP) .................................... 14169392

(51) Int. Cl.
*H01R 12/73* (2011.01)
*H05K 1/14* (2006.01)
(Continued)

(52) U.S. Cl.
CPC ....... *H01R 12/737* (2013.01); *H01R 12/7023* (2013.01); *H05K 1/11* (2013.01);
(Continued)

(58) Field of Classification Search
CPC ............. H05K 3/366; H05K 2201/048; H05K 2201/09645; H05K 2201/09172; H05K 2201/10598
See application file for complete search history.

(56) References Cited

U.S. PATENT DOCUMENTS 2,958,013 A * 10/1960 Ansley ..................... H05K 1/14
361/728
3,040,214 A * 6/1962 Slavin ...................... H01G 2/06
361/762
(Continued)

FOREIGN PATENT DOCUMENTS

CN        201555054 U    8/2010
DE        19936661 A1    2/2001
(Continued)

*Primary Examiner* — Ross Gushi
(74) *Attorney, Agent, or Firm* — Akarsh P. Belagodu

(57) ABSTRACT

A printed circuit board arrangement and a method for mounting a product to a main printed circuit board (100) at a substantially perpendicular angle, the printed circuit board arrangement comprises a main printed circuit board (100) comprising an elongated slot (102), and a product (128) comprising a connector portion (130) configured to be inserted into the elongated slot (102). The connector portion (130) is such that the product (128) may be attached at a substantially perpendicular angle to the main printed circuit board (100). The elongated slot (102) comprises a protrusion (104), and the connector portion (130) comprises a spring portion (132) configured to engage with the protrusion (104) when the connector portion (130) is inserted into the elongated slot (102). This results in a force pressing the connector portion (130) of the product (128) to at least one side wall of the elongated slot (102).

13 Claims, 3 Drawing Sheets

(51) Int. Cl.
*H05K 1/11* (2006.01)
*H05K 3/36* (2006.01)
*H01R 12/70* (2011.01)

(52) U.S. Cl.
CPC ............ *H05K 1/141* (2013.01); *H05K 3/366* (2013.01); *H05K 2201/048* (2013.01); *H05K 2201/09063* (2013.01); *H05K 2201/09081* (2013.01)

(56) References Cited

U.S. PATENT DOCUMENTS

| | | | | |
|---|---|---|---|---|
| 3,049,647 A * | 8/1962 | Lincoln | H01G 2/04 | 174/260 |
| 3,624,587 A * | 11/1971 | Conrad | H05K 3/366 | 174/263 |
| 3,765,076 A * | 10/1973 | Brandt | H05K 3/225 | 29/402.11 |
| 4,109,298 A * | 8/1978 | Hanni | H05K 3/326 | 174/261 |
| 4,336,419 A * | 6/1982 | Wakayama | H05K 1/184 | 174/261 |
| 4,495,546 A * | 1/1985 | Nakamura | H01L 23/5387 | 257/E23.177 |
| 4,521,065 A * | 6/1985 | Nestor | H01R 12/721 | 439/328 |
| 4,717,218 A * | 1/1988 | Ratcliff | H01R 12/7005 | 439/328 |
| 4,850,883 A * | 7/1989 | Kabadi | H01R 12/62 | 439/329 |
| 4,931,021 A * | 6/1990 | Mohan | G02B 6/3833 | 439/284 |
| 4,950,527 A * | 8/1990 | Yamada | H05K 3/363 | 174/250 |
| 5,035,641 A * | 7/1991 | Van-Santbrink | H01R 12/7023 | 439/329 |
| 5,049,089 A * | 9/1991 | Koenig | H01R 12/62 | 439/493 |
| 5,110,298 A * | 5/1992 | Dorinski | H01L 24/10 | 439/55 |
| 5,127,852 A * | 7/1992 | Cravens | H01R 13/745 | 439/545 |
| 5,321,585 A * | 6/1994 | Trittschuh, III | H05K 3/366 | 174/261 |
| 5,455,742 A * | 10/1995 | Phoy | H05K 3/366 | 174/250 |
| 5,484,965 A * | 1/1996 | Woychik | H05K 3/3452 | 174/260 |
| 5,581,877 A * | 12/1996 | Woychik | H01L 25/50 | 228/180.21 |
| 5,590,029 A * | 12/1996 | Estes | H05K 1/141 | 174/260 |
| 5,629,839 A * | 5/1997 | Woychik | H05K 3/366 | 361/784 |
| 5,754,411 A * | 5/1998 | Woychik | H05K 3/366 | 361/784 |
| 5,777,855 A * | 7/1998 | Yokajty | H01R 12/62 | 361/749 |
| 5,866,852 A * | 2/1999 | Benz | H05K 3/0097 | 174/255 |
| 5,907,475 A * | 5/1999 | Babinski | H05K 1/14 | 361/719 |
| 5,938,455 A * | 8/1999 | Glovatsky | H01R 12/58 | 439/290 |
| 5,954,536 A * | 9/1999 | Fuerst | H01R 12/79 | 439/493 |
| 6,062,911 A * | 5/2000 | Davis | H01R 13/2492 | 439/630 |
| 6,102,734 A * | 8/2000 | Kuo | H01R 13/73 | 439/545 |
| 6,135,781 A * | 10/2000 | Pope | H01R 12/716 | 439/59 |
| 6,246,016 B1 * | 6/2001 | Roessler | H01L 23/49805 | 174/261 |
| 6,304,082 B1 * | 10/2001 | Gualtieri | B82Y 25/00 | 324/247 |
| 6,366,473 B1 * | 4/2002 | Sauer | H01R 13/65802 | 361/749 |
| 6,440,775 B2 * | 8/2002 | Khoury | H01L 23/13 | 257/E23.004 |
| 6,452,754 B1 * | 9/2002 | Mizuta | G11B 5/486 | 174/117 FF |
| 6,482,019 B1 * | 11/2002 | Lo Forte | H01R 13/453 | 439/131 |
| 6,496,384 B1 * | 12/2002 | Morales | H05K 3/366 | 29/830 |
| 6,512,293 B1 * | 1/2003 | Chia | H01L 23/544 | 257/730 |
| 6,547,410 B1 | 4/2003 | Pederson | | |
| 6,560,116 B2 * | 5/2003 | Sauer | H01R 13/65802 | 211/41.17 |
| 6,661,674 B2 * | 12/2003 | Reniers | H01R 9/096 | 361/743 |
| 6,733,319 B1 * | 5/2004 | Jørgensen | H01R 4/48 | 439/329 |
| 6,775,151 B2 * | 8/2004 | Suzuki | H05K 3/366 | 361/736 |
| 6,843,675 B2 * | 1/2005 | Yamashita | H01R 43/0256 | 439/327 |
| 6,917,524 B2 * | 7/2005 | Pearson | H05K 1/142 | 361/732 |
| 6,930,889 B2 * | 8/2005 | Harrison | H05K 1/117 | 361/772 |
| 7,147,480 B2 * | 12/2006 | Ikeda | H01R 12/61 | 439/67 |
| 7,170,755 B2 * | 1/2007 | Keller | H05K 7/1454 | 361/727 |
| 7,182,610 B2 * | 2/2007 | Lin | H01R 12/707 | 439/567 |
| 7,203,074 B1 * | 4/2007 | Yaung | H05K 1/142 | 29/830 |
| 7,221,868 B2 * | 5/2007 | Terada | G03B 17/00 | 396/542 |
| 7,273,379 B2 * | 9/2007 | Jang | H05K 3/366 | 361/803 |
| 7,371,071 B2 * | 5/2008 | Cho | H01L 23/13 | 257/E23.004 |
| 7,379,021 B2 * | 5/2008 | Lee | H01Q 1/243 | 343/700 MS |
| 7,419,381 B2 * | 9/2008 | Jang | H05K 3/366 | 361/803 |
| 7,710,740 B2 * | 5/2010 | Liu | H05K 1/147 | 361/748 |
| 7,716,821 B2 * | 5/2010 | Yan | H05K 3/366 | 228/180.22 |
| 7,726,836 B2 | 6/2010 | Chen | | |
| 7,731,518 B2 * | 6/2010 | Miyazoe | H01R 12/721 | 439/328 |
| 7,804,695 B2 * | 9/2010 | Thevenard | H01Q 1/38 | 174/262 |
| 7,864,544 B2 * | 1/2011 | Smith | H05K 3/366 | 361/770 |
| 8,169,378 B2 * | 5/2012 | Barson | H01Q 1/005 | 343/770 |
| 8,272,897 B1 * | 9/2012 | Lin | H01R 12/724 | 439/607.4 |
| 8,698,004 B2 * | 4/2014 | Hasegawa | H05K 3/0097 | 174/255 |
| 8,734,000 B2 * | 5/2014 | Chiang | H05K 1/147 | 362/631 |
| 8,741,411 B2 * | 6/2014 | Yada | H05K 3/0097 | 361/752 |
| 8,951,068 B2 * | 2/2015 | Tai | H01R 12/52 | 439/620.18 |
| 8,998,660 B2 * | 4/2015 | Bakos | H01R 4/28 | 439/878 |
| 9,055,668 B2 * | 6/2015 | Hasegawa | H05K 3/0097 | |
| 9,095,069 B2 * | 7/2015 | Stefanoff | H05K 1/142 | |

(56) References Cited

U.S. PATENT DOCUMENTS

| | | | |
|---|---|---|---|
| 9,173,335 B2* | 10/2015 | Chen | H05K 1/147 |
| 9,271,419 B1* | 2/2016 | Hsiao | H05K 7/1432 |
| 9,271,420 B1* | 2/2016 | Hsiao | H05K 7/1432 |
| 9,277,650 B2* | 3/2016 | Ishihara | H05K 1/142 |
| 9,277,655 B2* | 3/2016 | Ishihara | H05K 1/142 |
| 9,370,101 B2* | 6/2016 | Ishihara | H05K 3/0032 |
| 9,426,889 B2* | 8/2016 | Liu | H05K 1/147 |
| 9,590,344 B2* | 3/2017 | Krishnamoorthy | H01R 12/732 |
| 9,603,238 B2* | 3/2017 | Takahashi | H05K 1/0271 |
| 2002/0071259 A1* | 6/2002 | Roos | H05K 3/366 |
| | | | 361/784 |
| 2002/0080594 A1* | 6/2002 | Sauer | H01R 13/65802 |
| | | | 361/818 |
| 2003/0141104 A1 | 7/2003 | Bruckmann et al. | |
| 2003/0236006 A1* | 12/2003 | Yamashita | H01R 43/0256 |
| | | | 439/65 |
| 2004/0214466 A1* | 10/2004 | Lin | H05K 1/142 |
| | | | 439/325 |
| 2006/0070768 A1* | 4/2006 | Lee | H05K 3/366 |
| | | | 174/250 |
| 2006/0128174 A1* | 6/2006 | Jang | H05K 3/366 |
| | | | 439/65 |
| 2006/0292898 A1* | 12/2006 | Meredith | H05K 1/184 |
| | | | 439/65 |
| 2007/0096995 A1* | 5/2007 | Lee | H01Q 1/243 |
| | | | 343/702 |
| 2007/0291454 A1 | 12/2007 | Jang et al. | |
| 2009/0117760 A1* | 5/2009 | Takahashi | H05K 1/119 |
| | | | 439/79 |
| 2010/0202119 A1* | 8/2010 | Nagami | H05K 1/0281 |
| | | | 361/749 |
| 2010/0277883 A1 | 11/2010 | Matsuda et al. | |
| 2011/0096517 A1* | 4/2011 | Yada | H05K 3/0097 |
| | | | 361/752 |
| 2011/0149543 A1* | 6/2011 | Kamoi | H05K 1/141 |
| | | | 361/803 |
| 2011/0305852 A1* | 12/2011 | Sugaya | H05K 3/0044 |
| | | | 428/33 |
| 2013/0078825 A1* | 3/2013 | Wain | H05K 3/366 |
| | | | 439/64 |
| 2013/0284501 A1 | 10/2013 | McConnell et al. | |

FOREIGN PATENT DOCUMENTS

| | | |
|---|---|---|
| DE | 202011002439 U1 | 5/2011 |
| GB | 2142477 A | 1/1985 |
| WO | 0139568 A1 | 5/2001 |
| WO | 2007036181 A1 | 4/2007 |

* cited by examiner

PRINTED CIRCUIT BOARD ARRANGEMENT AND METHOD FOR MOUNTING A PRODUCT TO A MAIN PRINTED CIRCUIT BOARD

CROSS-REFERENCE TO PRIOR APPLICATIONS

This application is the U.S. National Phase application under 35 U.S.C. §371 of International Application No. PCT/EP2015/060829, filed on May 18, 2015, which claims the benefit of European Patent Application No. 14169392.9, filed on May 22, 2014. These applications are hereby incorporated by reference herein.

TECHNICAL FIELD OF THE INVENTION

The present invention relates to a printed circuit board arrangement and a method for mounting a product to a main printed circuit board at a substantially perpendicular angle.

BACKGROUND

Printed circuit boards have been used since a long time to allow electronic manufacturers and electronic designers a simple tool for organizing and attaching electronic circuits and components on a platform suitable for each application. However, as there is often a need for a modular design, alternative support structures, or components which require added space, a common solution is to use one or several secondary boards comprising the electronic circuits or components needed, or brackets which hold the circuit board in place within a supporting structure for example in an industrial environment. The assembly of such a system, e.g. a daughterboard or a bracket requires the main printed circuit board to be held in some manner and the daughterboard or bracket to be introduced at a perpendicular angle to be able attached by means of soldering or the like later.

A way to mount the daughterboard to the main printed circuit board is to use tools which hold the main board and the daughter board to be attached. Tools may be expensive, and may even require configurations for each possible product to be attached. Further, the step of attaching or arranging the tools would be an additional step during assembly of a printed circuit board arrangement. The tools and/or steps required may thus be both expensive and time-consuming. Hence, there is a need for a simple, cheap and reliable way to assemble a printed circuit board arrangement.

SUMMARY

With regards to the above-mentioned desired properties of a printed circuit board arrangement, it is a general object of the present invention to provide a printed circuit board arrangement which is simple, cheap, and easy to manufacture.

According to a first aspect of the invention, these and other objectives are achieved with a printed circuit board arrangement, comprising: a main printed circuit board comprising an elongated slot; and a product comprising a connector portion configured to be inserted into the elongated slot, such that the product may be attached at a substantially perpendicular angle to the main printed circuit board. The elongated slot comprises a protrusion, and the connector portion comprises a spring portion configured to engage with the protrusion when the connector portion is inserted into the elongated slot, resulting in a force pressing the connector portion of the product to at least one side wall of the elongated slot.

By printed circuit board, it should be understood that the main printed circuit board is in principle flat and mostly has extensions in two dimensions, i.e. length and width and a limited thickness which is substantially smaller than the length and width of the main printed circuit board.

An elongated slot is substantially longer than it is wide in a longitudinal direction. Thus a protrusion is understood to extend into the elongated slot from a sidewall of the elongated slot. A sidewall should be construed as the elongated walls of the elongated slot.

By being substantially perpendicular it should be understood that the product is to be arranged at a perpendicular angle to the two large dimensions i.e. length and width of the main printed circuit board.

The connector portion is configured to be inserted into the elongated slot and should thus be construed to be of equal or less width and thickness as the elongated slot.

A spring portion which results in a force should herein be interpreted as a portion of the product which bends, and provides a spring force as a response to the strain imposed on the material which is bent.

The present invention is based on the realization that by providing a spring portion of a connector portion of a product to be mounted with a main printed circuit board which has an elongated slot comprising a protrusion, the connector portion may be inserted in the elongated slot, and thus allowing the protrusion and the spring portion to engage. Thereby, the product may be held at a substantially perpendicular angle to the main printed circuit board by the forces produced by the engaging of the spring portion by the protrusion. The present invention allows for a simple mounting of a product to a main printed circuit board without any need for additional tools or components. Thereby, the present invention allows for a low cost production by eliminating the need for such tools or components. Moreover, steps which would require fitting, holding or attaching such tools or components are not required by the present invention, thus reducing the number of steps during such a mounting operation. An additional advantage of the present invention is that the production tolerance for the connector portions is reduced as the force provided by the engaging of the protrusion and spring portion will provide a force holding the product at a substantially perpendicular angle without an exact tolerance of the connector portion. Yet another advantage is the reduced requirements on the material forming the main printed circuit board such that the main printed circuit board may be formed by commonly used low cost materials. Yet another advantage is that only a small space on the main printed circuit board is required, whereby compact electronics design are not blocked.

According to one embodiment of the invention, the protrusion may be wedge shaped with at least one sloping surface. By forming the protrusion wedge shaped with at least one sloping surface the insertion of the connection portion into the elongated slot may be facilitated by the spring portion which will first engage the sloping surface and thus be increasingly bent during the insertion.

According to another embodiment of the invention, the spring portion may be formed with an outer sloping edge, whereby insertion of the connector portion into the elongated slot engages the outer sloping edge with the sloping surface of the wedge shaped protrusion such that the spring portion is forced to bend. To even further facilitate the insertion of the connector portion, the spring portion may have an outer edge which is sloping. Hence, the outer sloping edge may engage with the sloping surface of the wedge shaped protrusion at insertion which will allow the spring portion and protrusion to easily slide against each other.

According to one embodiment, the spring portion further comprises a recess on a surface thereof, the recess being configured to reduce the force produced by the spring portion. The recess will reduce the amount of material being bent.

According to another embodiment, the spring portion may be formed by a right-angled cut extending into the product from an outer edge of the product, and the spring portion is formed by the material extending from the right-angled cut towards the outer edge of the product. A simple and efficient way to form a spring portion in an e.g. substantially rectangular product may be to form a right-angled cut which extends from an outer edge of the product, which allows the spring portion to be formed from the material remaining from the right-angled cut. Thus providing a spring portion integral to the product and formed from the same material thereof.

According to one embodiment, the product may be a secondary printed circuit board. The present invention also allows a simple and efficient way to arrange a secondary printed circuit board. A secondary printed circuit board may also be known as a daughterboard. The secondary printed circuit board may comprise functionality or components not found or not able to be placed on the main printed circuit board due to e.g. space restriction on the main printed circuit board. An additional advantage of the present invention is then also that the strain imposed on the spring portion is in the strong direction of the material of the secondary circuit boards.

According to another embodiment, the product may be a secondary printed circuit board and the main printed circuit board may comprise a main electronic circuit having electrical connections terminating at the elongated slot, and the secondary printed circuit board may comprise a secondary electronic circuit having electrical connections terminating in the connector portion. By providing electrical connections which terminate where the connector portion is inserted into the elongated slot the main electronic circuit and the secondary electronic circuit may efficiently and simply be electrically connected at the elongated slot by either direct mechanical contact or later introduced components and/or solder.

According to one embodiment, the secondary printed circuit board may be formed in a FR-4 material. As FR-4 is a typical strain resistant type of printed circuit board material, it may be advantageous to provide a more strain-resistant secondary printed circuit board by forming it in a FR-4 material.

According to another embodiment, the secondary printed circuit board may be formed in a FR-1 material or a CEM-1 material. In order to further save costs, the secondary printed circuit board may be formed in a low cost i.e. cheaper FR-1 or CEM-1 material. As the bending direction is in the strong material direction i.e. the strain direction is in the large dimensions of the secondary printed circuit board. The secondary printed circuit board and thus the spring portions can be formed by in a cheaper material such as FR-1 or CEM-1.

According to one embodiment, the product may be a metal plate or bracket. A metal plate or bracket may be used to provide a suitable attachment for the main printed circuit board. Thus, the present invention further allows a simple and efficient way to mount further components or even mount the main printed circuit board itself by allowing the product to be a metal plate or bracket on which the main printed circuit board may be mounted. Likewise, it is possible that the product is a bracket on which other components are mounted.

According to another embodiment, the arrangement may further comprise a soldering joint between the main printed circuit board and the product. A soldering joint between the main printed circuit board and the product will fixate and hold the main printed circuit board and the product together. Further, if the product is secondary printed circuit board the soldering joint may enable electrical contact between the main printed circuit board and the secondary printed circuit board as well as the mechanical connection.

According to a second aspect of the invention, the objectives are also achieved with a method for mounting a product to a main printed circuit board at a substantially perpendicular angle, the method comprising the steps of providing the main printed circuit board comprising an elongated slot which comprises a protrusion, and the product comprising an connector portion comprising a spring portion, and inserting the connector portion of the product into the elongated slot at a substantially perpendicular angle, whereby the protrusion engages with the spring portion resulting in a force pressing the connector portion of the product to at least one side wall of the elongated slot.

According to one embodiment of the invention, the method may further comprise the step of soldering between the main printed circuit board and the product to provide a soldering joint.

According to another embodiment of the invention the main printed circuit board may comprise a main electronic circuit having electrical connections terminating at the elongated slot, and the product is a secondary printed circuit board comprising a secondary electronic circuit having electrical connections terminating in the connector portion, whereby the soldering joint connects the main electronic circuit and the secondary electronic circuit.

Effects and features of this second aspect of the present invention are largely analogous to those described above in connection with the first aspect of the invention.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing different embodiments of the invention.

DETAILED DESCRIPTION OF THE DRAWINGS

In the present detailed description, embodiments of a printed circuit board arrangement according to the present invention are mainly discussed with reference to a planar-view showing the either the main printed circuit board or a product. It should be noted that this by no means limit the scope of the invention, which is also applicable in other circumstances for instance with other types of printed circuit boards. Further, the present invention is mainly discussed using an elongated slot having a protrusion in the middle of a sidewall of the elongated slot, however the present invention is also applicable where the protrusion is anywhere along a sidewall of the elongated slot. Moreover the dimensions and/or number of elongated slots and protrusions shown in the enclosed drawings is only a schematic representation. In use, the number, dimensions and other such details will be decided by each application.

The invention will now be described with reference to the enclosed drawings where first attention will be drawn to the structure, and then secondly the function.

Figure 1A:
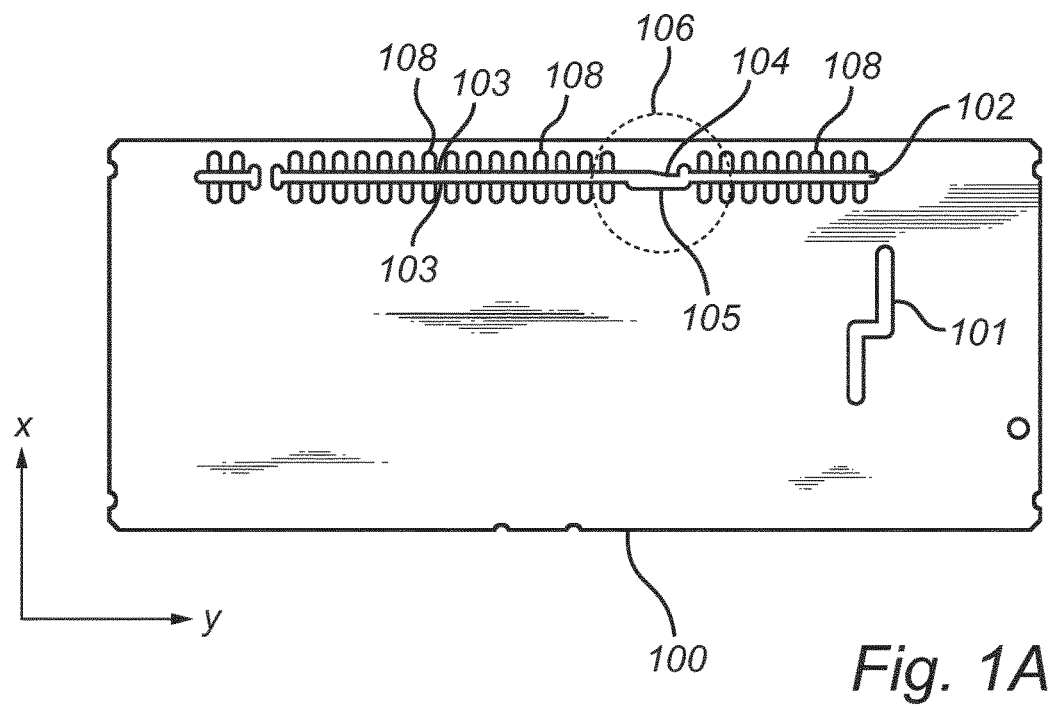
FIG. 1A and is a top view of a main printed circuit board.
Figure 2:
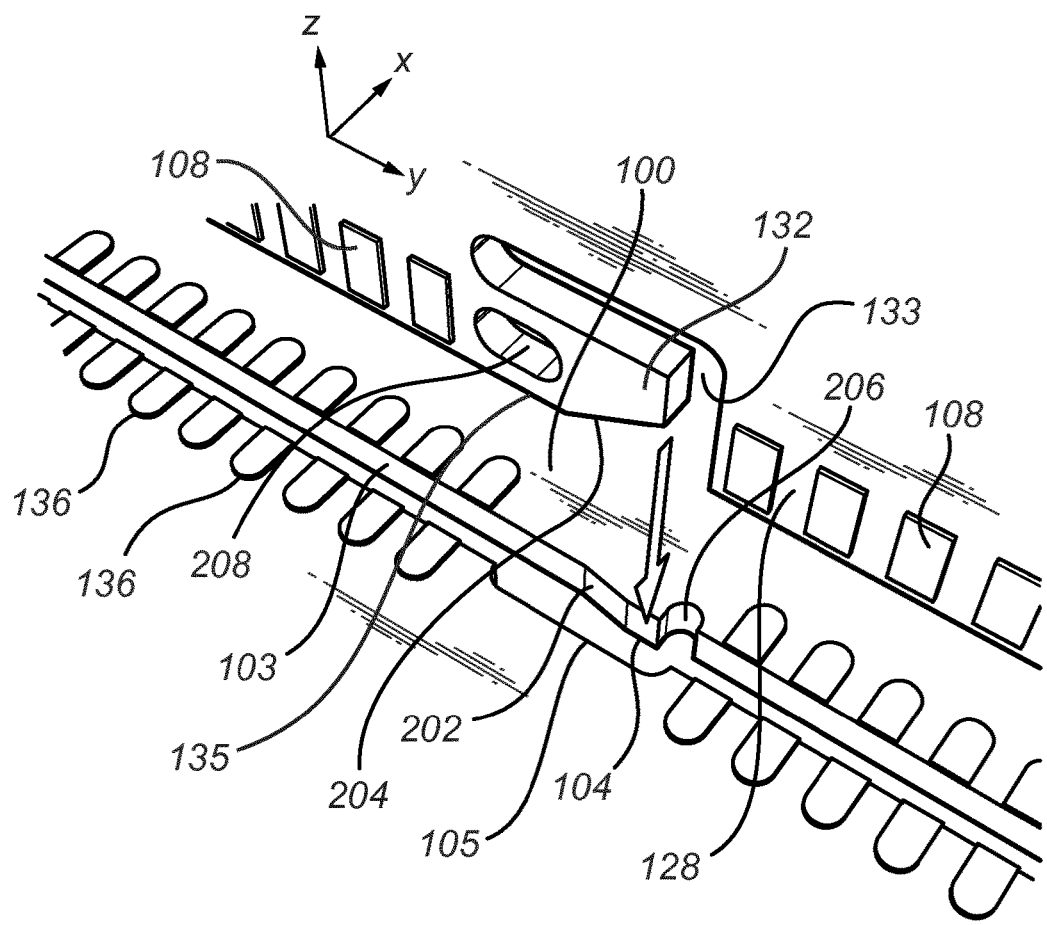
FIG. 2 is a detailed perspective view of a protrusion and a spring portion of a connector portion according to one embodiment of the invention.

FIG. 1A shows a main printed circuit board 100 having an elongated slot 102 therein. The elongated slot 102 comprises sidewalls 103 on each elongated side, and a protrusion 104 formed from the main printed circuit board 100. The protrusion 104 extends from one of the sidewalls of the elongated slot 102 inwards in the elongated slot 102. The elongated slot 102 may be through-going to facilitate an easier insertion. An area of interest 106 which will be discussed later in conjunction with FIG. 2 is marked. Along the elongated slot 102 there are a number of electrical connections 108. The main printed circuit board may also comprise a range of electrical components (not shown) which may be in electrical contact with the electrical connections 108. Note that the dimensions of length and width along the x- and y-axis are the large dimensions of the board. A printed circuit board is typically much thinner than it is long and wide, a typical thickness is 1-5 mm.

The protrusion 104 is wedge shaped with at least one sloping surface. The sloping surface will allow a spring portion on a product 128 to more easily be inserted. The elongated slot 102 may also comprises a recess 105 which is arranged opposite the protrusion 104 and configured to provide a space for a spring portion 132 to be bent into when the spring portion 132 engages with the protrusion 104.

The main printed circuit board 100 also comprises a notch 101 which is intended to be used to identify which side of the main printed circuit board 100 an observer is seeing.

Also note that the main printed circuit board 100 shown is arranged in the y-x plane.

Figure 1B:
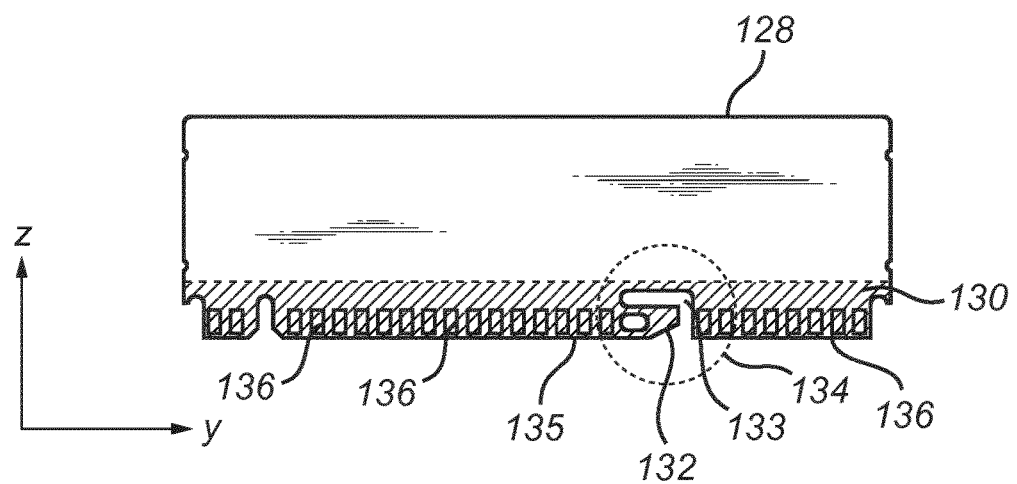
FIG. 1B is a side view of a product according to one embodiment of the invention.

FIG. 1B shows a product 128, the product 128 comprises a connector portion 130 which has the spring portion 132 formed essentially therein. An area of interest 134 which will be discussed later in conjunction with FIG. 2 is marked. The product 128 may be a secondary printed circuit board i.e. a daughterboard to the main board or motherboard 100. Therefore, the connector portion 130 may comprise a number of electrical connections 136. In such a case that the product is a secondary printed circuit board it may comprise a range of electrical components (not shown) which may be in contact with the electrical connections 136.

The connector portion 130 comprises the spring portion 132 which is formed by a right-angled cut 133 extending into the product 128 from an outer edge 135 of the product 128. Thereby the spring portion 132 is formed by the material extending from the right-angled cut 133 towards the outer edge 135 of the product 128.

Also note that the product 128 is arranged in the z-y plane, which is different than the orientation of the main printed circuit board 100. This is because the connector portion 130 of the product 128 is intended to be inserted in the elongated slot 102 of the main printed circuit board 100 at a perpendicular angle and moved with a negative movement along the z-axis.

When the connector portion 130 is inserted into the elongated slot 102 the protrusion 104 will force the spring portion 132 to be bent. As the spring portion is bent the connector portion 130 and the product will be forced to at least one sidewall of the elongated slot 102. This will hold the product 128 at a substantially perpendicular angle from the main printed circuit board 100.

FIG. 2 shows the protrusion 104 and the spring portion 132 prior to any engagement with each other. Note that the orientation is now a perspective view and that the coordinate axes are also indicated. The protrusion 104 is formed by the material of the main printed circuit board 100 and is wedge shaped with a sloping surface 202. Adjacent to the wedge shaped protrusion 202 there is also a recess 206.

As described above the spring portion 132 may be formed by a right angled cut 133 into the product 128 from an outer edge 135. The spring portion 132 may also comprise an outer sloping edge 204. The outer sloping edge 204 extends from the outer edge 135 of the product 128 and will, when the product 128 is moved towards insertion into the elongated slot 102, engage with the sloping surface 202 of the protrusion 104. Further, the spring portion 132 comprises a recess herein shown as a through-going hole 208, the hole 208 is configured to reduce the force produced by the spring portion 132 when it engages or has engaged with the protrusion 104. This is achieved by the hole 208 which reduces the amount of material which needs to be strained and bent.

Figure 3:
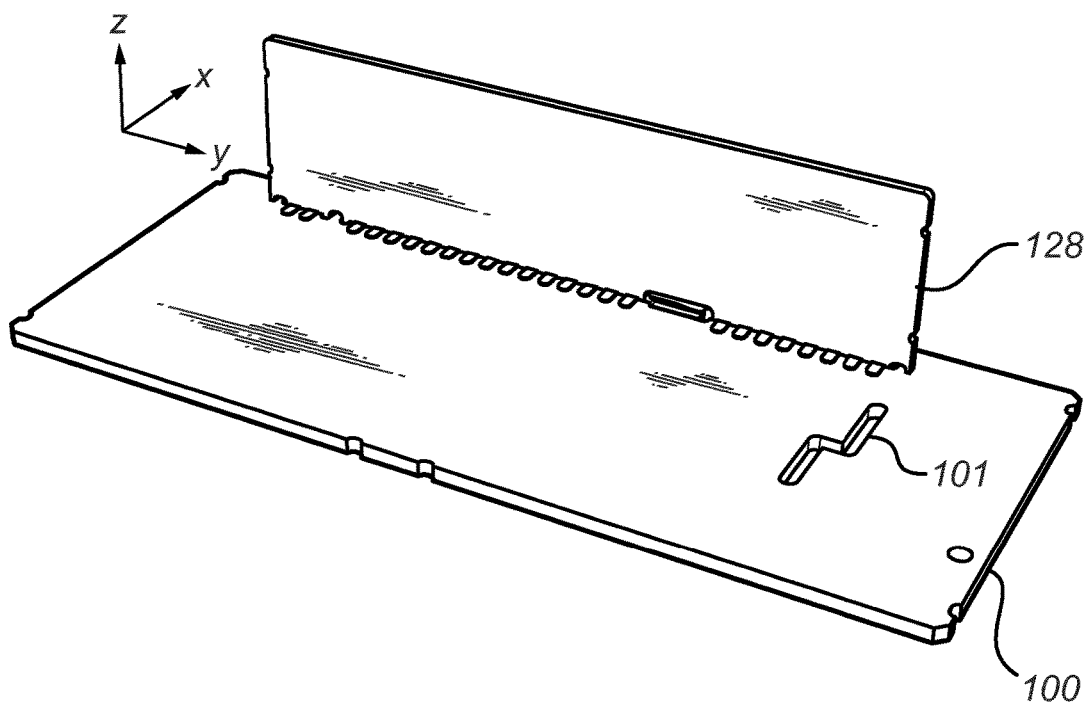
FIG. 3 is a perspective view of a printed circuit board arrangement according to one embodiment of the invention.

FIG. 3 shows a printed circuit board arrangement where the connector portion 130 of the product 128 has been inserted into the elongated slot 102 of the main printed circuit board 100. The notch 101 indicates that it is the same side as in earlier which of the main printed circuit board 100 which is observed. Note that the secondary printed circuit board 128 is held at a substantially perpendicular angle by the force produced by the spring portion 132 engaging the protrusion 104. This allows for a simple step of assembling the printed circuit board arrangement by inserting, and the electrical connections 106, 136 may be connected by soldering or other suitable connecting means. Therefore, the printed circuit board arrangement can also comprise a soldering joint (not shown) between the main printed circuit board 100 and the product 128.

Figure 4:
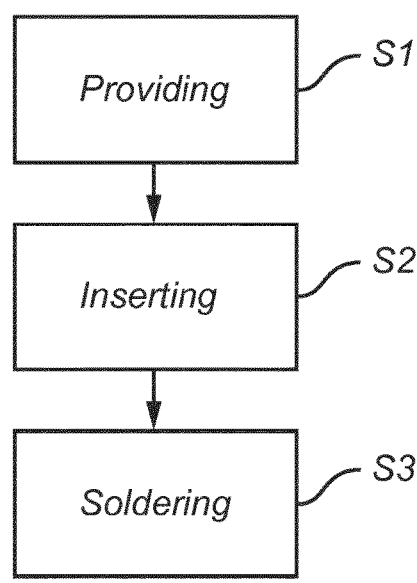
FIG. 4 is a flowchart illustrating steps of method for mounting a product to a main printed circuit board at a substantially perpendicular angle according to one embodiment of the invention.

FIG. 4 shows a flowchart illustrating steps of method for mounting a product 128 to a main printed circuit board 100 at a substantially perpendicular angle.

First, in step S1, the main printed circuit board 100 comprising an elongated slot 102 which comprises a protrusion 104, and the product 128 comprising a connector portion 130 comprising a spring portion 132 are provided.

Referring now to step S2, the connector portion 130 of the product is inserted into the elongated slot 102 at a substantially perpendicular angle, whereby the protrusion 104 engages with the spring portion 132 resulting in a force pressing the connector portion 130 of the product to at least one sidewall 103 of the elongated slot 102.

Then, optionally in step S3, a joint is soldered between the main printed circuit board 100 and the product 128 to provide a soldering joint. The soldering joint provides a mechanical connection. If electrical connections 108, 136 are present, also electrical connection may be provided by the soldering joint. The mechanical connection of the soldering joint will fixate and hold the secondary printed circuit board 128 at a substantially perpendicular angle from the main printed circuit board.

The main printed circuit board 100 can be formed in a CEM-1 material, or any other type of commonly used low cost printed circuit board material. CEM-1 is low cost, flame retardant, cellulose paper based laminate with only one layer of woven glass fabric. The secondary printed circuit board 128 can formed in a FR-4 material (woven glass and epoxy). Optionally any other type of commonly used low cost printed circuit board material can be used e.g. CEM-1 or FR-1.

Note that in all described examples the product 128 could be a metal plate or bracket which would have the same structural features and functions as the above described example. A metal plate or bracket 128 may for example be used to hold a main printed circuit board within a electronic storage unit (not shown) of some kind. Electronic storage units are often used in e.g. industrial environments to protect electronic components and printed circuit boards from direct mechanical or similar interactions.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination may not be used to an advantage.

The invention claimed is:

1. A printed circuit board arrangement, comprising:
   a main printed circuit board comprising an elongated slot; and
   a product comprising a connector portion configured to be inserted into said elongated slot, such that the product is attached at a substantially perpendicular angle to the main printed circuit board,
   wherein the elongated slot comprises a protrusion, and wherein said connector portion comprises a spring portion configured to engage with said protrusion when the connector portion is inserted into said elongated slot, resulting in a force pressing said connector portion of the product to at least one side wall of the elongated slot said force holding the product at a substantially perpendicular angle, and
   wherein said spring portion further comprises a recess on a surface thereof, said recess being configured to reduce the force produced by said spring portion.

2. The arrangement according to claim 1, wherein said protrusion is wedge shaped with at least one sloping surface.

3. The arrangement according to claim 2, wherein said spring portion is formed with an outer sloping edge, whereby insertion of said connector portion into said elongated slot engages said outer sloping edge with said sloping surface of said wedge shaped protrusion such that said spring portion is forced to bend.

4. The arrangement according to claim 1, wherein said spring portion is formed by a right-angled cut extending into said product from an outer edge of said product, and said spring portion is formed by the material extending from said right-angled cut towards said outer edge of said product.

5. The arrangement according to claim 1, wherein said product is a secondary printed circuit board.

6. The arrangement according to claim 5, wherein said secondary printed circuit board is formed in a FR-4 material.

7. The arrangement according to claim 5, wherein said secondary printed circuit board is formed in a FR-1 material or a CEM-1 material.

8. The arrangement according to claim 1, wherein said product is a secondary printed circuit board and said main printed circuit board comprises a main electronic circuit having electrical connections terminating at said elongated slot, and wherein said secondary printed circuit board comprises a secondary electronic circuit having electrical connections terminating in said connector portion.

9. The arrangement according to claim 1, wherein said product is a metal plate or bracket.

10. The arrangement according to claim 1, further comprising a soldering joint between the main printed circuit board and said product.

11. A method for mounting a product to a main printed circuit board at a substantially perpendicular angle, said method comprising the steps of:
    providing the main printed circuit board comprising an elongated slot which comprises a protrusion, and the product comprising an connector portion comprising a spring portion; and
    inserting said connector portion of said product into said elongated slot at a substantially perpendicular angle, wherein inserting said connector portion into said elongated slot comprises:
      engaging said protrusion with said spring portion resulting in a force pressing said connector portion of the product to at least one side wall of the elongated slot, and
      reducing the force produced by said spring portion through a recess formed on a surface of said spring portion.

12. The method according to claim 11, wherein the method further comprises the step of:
    soldering between the main printed circuit board and said product to provide a soldering joint.

13. The method according to claim 12, wherein the main printed circuit board comprises a main electronic circuit having electrical connections terminating at said elongated slot, and said product is a secondary printed circuit board comprising a secondary electronic circuit having electrical connections terminating in said connector portion, whereby said soldering joint connects said main electronic circuit and said secondary electronic circuit.

* * * * *